(12) United States Patent
Jiang

(10) Patent No.: US 7,554,360 B1
(45) Date of Patent: Jun. 30, 2009

(54) HIGH SPEED LEVEL SHIFTER CIRCUIT IN ADVANCED CMOS TECHNOLOGY

(75) Inventor: Bin Jiang, Singapore (SG)

(73) Assignee: Marvell International Ltd. (BM)

( * ) Notice: Subject to any disclaimer, the term of this patent is extended or adjusted under 35 U.S.C. 154(b) by 18 days.

(21) Appl. No.: 11/398,387

(22) Filed: Apr. 4, 2006

Related U.S. Application Data

(60) Provisional application No. 60/724,163, filed on Oct. 6, 2005.

(51) Int. Cl.
  *H03K 19/0175* (2006.01)
(52) U.S. Cl. .................................... 326/68; 326/81
(58) Field of Classification Search ............ 326/68, 326/62, 63, 80, 81
  See application file for complete search history.

(56) References Cited

U.S. PATENT DOCUMENTS

| | | | | |
|---|---|---|---|---|
| 4,888,498 | A * | 12/1989 | Kadakia | 327/546 |
| 5,444,396 | A * | 8/1995 | Soneda | 326/81 |
| 7,071,730 | B2 * | 7/2006 | Cordoba | 326/38 |
| 7,145,363 | B2 * | 12/2006 | Kim | 326/68 |
| 2005/0258864 | A1 * | 11/2005 | Chen et al. | 326/81 |

* cited by examiner

*Primary Examiner*—Rexford Barnie
*Assistant Examiner*—Thienvu V Tran

(57) ABSTRACT

A level shifter circuit for shifting from a first voltage level technology (such as 0.9 volt) to a second level voltage technology (such as 3.3 volt) with increased switching speed. The increased speed is achieved by adding a boost circuit to the pull-up transistors to boost the switching speed and shut itself down after the transition. The level shifter circuit does not require intermediate level transistors or intermediate level voltage sources.

16 Claims, 8 Drawing Sheets

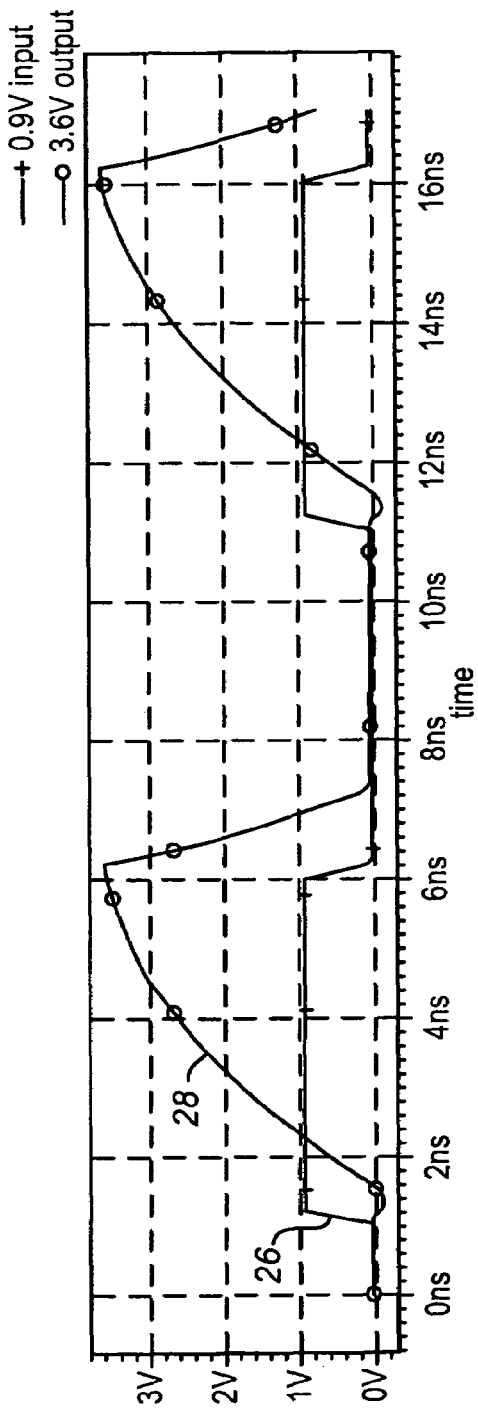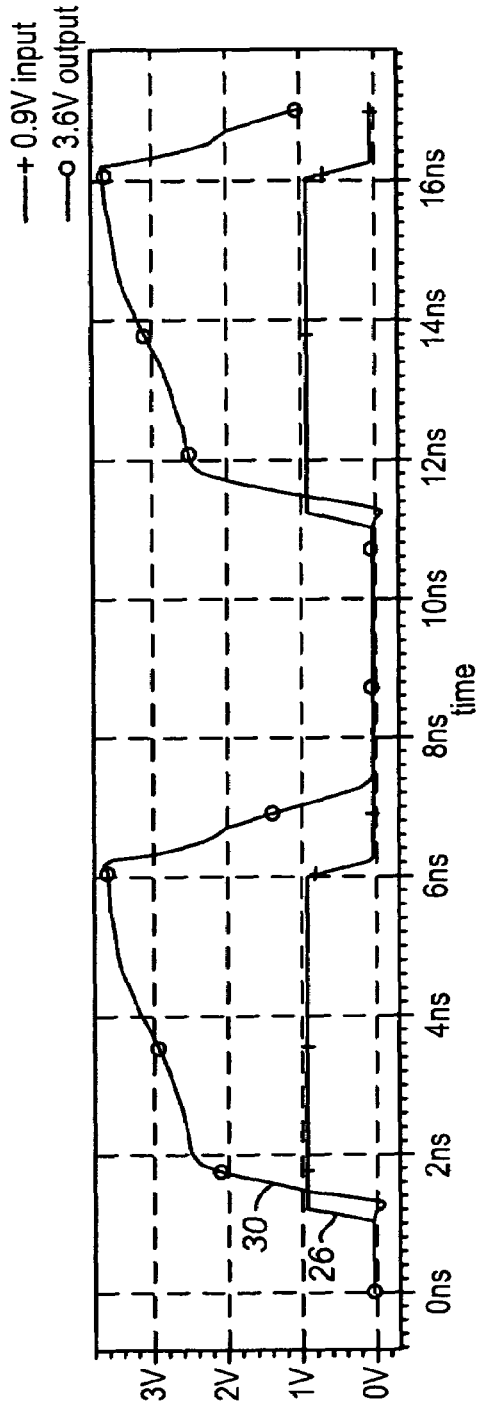

HIGH SPEED LEVEL SHIFTER CIRCUIT IN ADVANCED CMOS TECHNOLOGY

CROSS-REFERENCES TO RELATED APPLICATIONS

This application claims priority from provisional application No. 60/724,163, entitled "A High Speed Level Shifter Circuit in Advanced CMOS Technology," filed on Oct. 6, 2005.

BACKGROUND OF THE INVENTION

The present invention relates to shifter circuits, and in particular to level shifter circuits for (in one example) 0.9 volt to 3.3 volt technology with increased switching speed.

The feature size of transistors in CMOS technology continues to shrink as technology advances. As a result, the core supply voltage of the integrated circuit chips also drops. For example, the core supply voltage drops to 0.9V from 10.5V when moving from 0.15 um technology to 90 nm technology. However, when the chip is going to interface with outside components, in many cases it needs to be compatible with older technologies with a 3.3V supply. Therefore, a level shifter circuit is required to convert the signals in from the core supply level to the IO supply level in order to communicate with outside components.

The task of converting a 1.5V signal to a 3.3V signal can be fulfilled by a conventional level shifter circuit illustrated in FIG. 1. However, in 90 nm technology or other technologies that provide a very low core supply voltage, the level shifter circuit in FIG. 1 will be insufficient and can only survive with very low speed signals when converting 0.9V signals to 3.3V signals directly.

In a level shifter circuit, as the one in FIG. 1, when the input signal goes from '0' to '1', NMOS transistor N1 changes status from OFF to ON immediately, and NMOS transistor N2 will change status from ON to OFF as the output of inverter 10 changes from '1' to '0'. Initially, the output of the level shifter IO_SUPPLY_SIGNAL stays at '0' and net OUT_BAR stays at '1'. As a result, pull-up transistor P1 will stay ON and pull-up transistor P2 will stay OFF. However, this is not a balanced status and will be changed as described below.

As we can see now, transistor N1 is trying to drive the net OUT_BAR to low while transistor P1 is trying to keep the net OUT_BAR high. Transistor N1 has to win over transistor P1 to make the switching of status happen. When the net OUT_BAR is driven low enough to turn on transistor P2, the output signal IO_SUPPLY_SIGNAL will rise, without the need of fighting with another transistor since transistor P2 is OFF. When IO_SUPPLY_SIGNAL rises to high enough to turn off transistor P1, the switching process will be accelerated until IO_SUPPLY_SIGNAL reaches the IO supply level.

To make sure the level shifter works, the NMOS transistor N1, when driven by a core supply level signal, has to win over PMOS transistor P1 with its source connected to the IO supply and its gate driven by ground under all scenarios. The same rule applies to transistor N2 and transistor P2. As a result, PMOS transistors P1 and P2 have to be made rather weak. Therefore, when in the case of low core supply and high IO supply, the conventional level shifter switches slowly and cannot meet the high-speed signal requirement.

A simulation result is presented in FIG. 4A. It simulates a conventional level shifter trying to handle a 100 MHz 0.9V input signal with an IO supply of 3.6V. 3.6V is a commonly tolerated 3.3V IO supply variation. As can be seen, the switching turn on rise signal 28 is slow.

FIG. 2 illustrates one way to address the problem of slow switching. The level shifter can be done in two steps. First, level shifter 12 converts 0.9V signals to 1.8V signals, after that level shifter 14 converts 1.8V signals to 3.3V signals.

The first stage level shifter of FIG. 2, level shifter 12, is composed of input and output NMOS transistors N10 and N20, respectively, corresponding to transistors N1 and N2 of FIG. 1. PMOS transistors P10 and P20 correspond to transistors P1 and P2 of FIG. 1. However, an intermediate supply of 1.8V is used, instead of the 3.3V supply of FIG. 1. Level shifter 12 uses an inverter 16 similar to inverter 10 of FIG. 1. An intermediate voltage level 20 is provided to a second stage level shifter circuit 14.

The second stage level shifter circuit 14 consists of NMOS transistors N12 and N22, joined by inverter 18. Pull-up PMOS transistors P12 and P22 are provided. Here, the supply is 3.3V, with the input being in the 1.8V range.

The drawbacks of the two level scheme of FIG. 2 are:
1. An additional power supply such as 1.8V needs to be generated;
2. Additional oxide masks are needed to provide 1.8V transistors; and
3. Two-steps conversion increases propagation delay of the signals.

BRIEF SUMMARY OF THE INVENTION

The present invention in various embodiments provides a level shifter circuit for shifting from a first voltage level technology (such as 0.9 volt) to a second level voltage technology (such as 3.3 volt) with increased switching speed. The increased speed is achieved by adding a boost circuit to the pull-up transistors to boost the transition at lower voltage levels. The boost circuit includes a strong pull-up transistor which is only working for the period during the switching transition, and thus can pull-up more quickly at lower voltages.

In embodiments of the present invention, the boost circuitry can be made with the same process steps, thus not requiring additional oxide masks to provide intermediate voltage transistors. In addition, since the boost pull-up transistor is designed to automatically shut off the boost circuit at the end of the transition process. Thus, the boost pull-up transistor can either be the same size as the main pull-up transistors, or could be a larger size, since they will not interfere with the NMOS input and output transistors during normal static operation.

In one embodiment, the boost circuit includes an NMOS pull-up transistor with its source connected to the drain of the first pull-transistor to assist in the pulling-up at lower voltages and a PMOS pull-up transistor with its source connected to the drain of said NMOS pull-up transistor. One PMOS transistor bias the gate of the NMOS boost pull-up transistor to the 3.3V supply voltage. Thus, the NMOS pull-up transistor and PMOS pull-up transistor will be activated and delivering current to help pull up faster than the main pull-up transistor, increasing the switching speed. When the output signal rises to the 3.3V level less the voltage threshold for the NMOS transistor, the boost-pull-up transistor will no longer provide pull-up and thus effectively shuts off, eliminating itself from the circuit in a static condition.

BRIEF DESCRIPTION OF THE DRAWINGS

FIG. 4A is a voltage waveform graph showing a simulation of the input and output wave forms for the prior art level shifter of FIG. 1.

FIG. 4B is a graph of the input and output voltage waveforms simulated for the embodiment of the level shifter in FIG. 4.

DETAILED DESCRIPTION OF THE INVENTION

Figure 1:
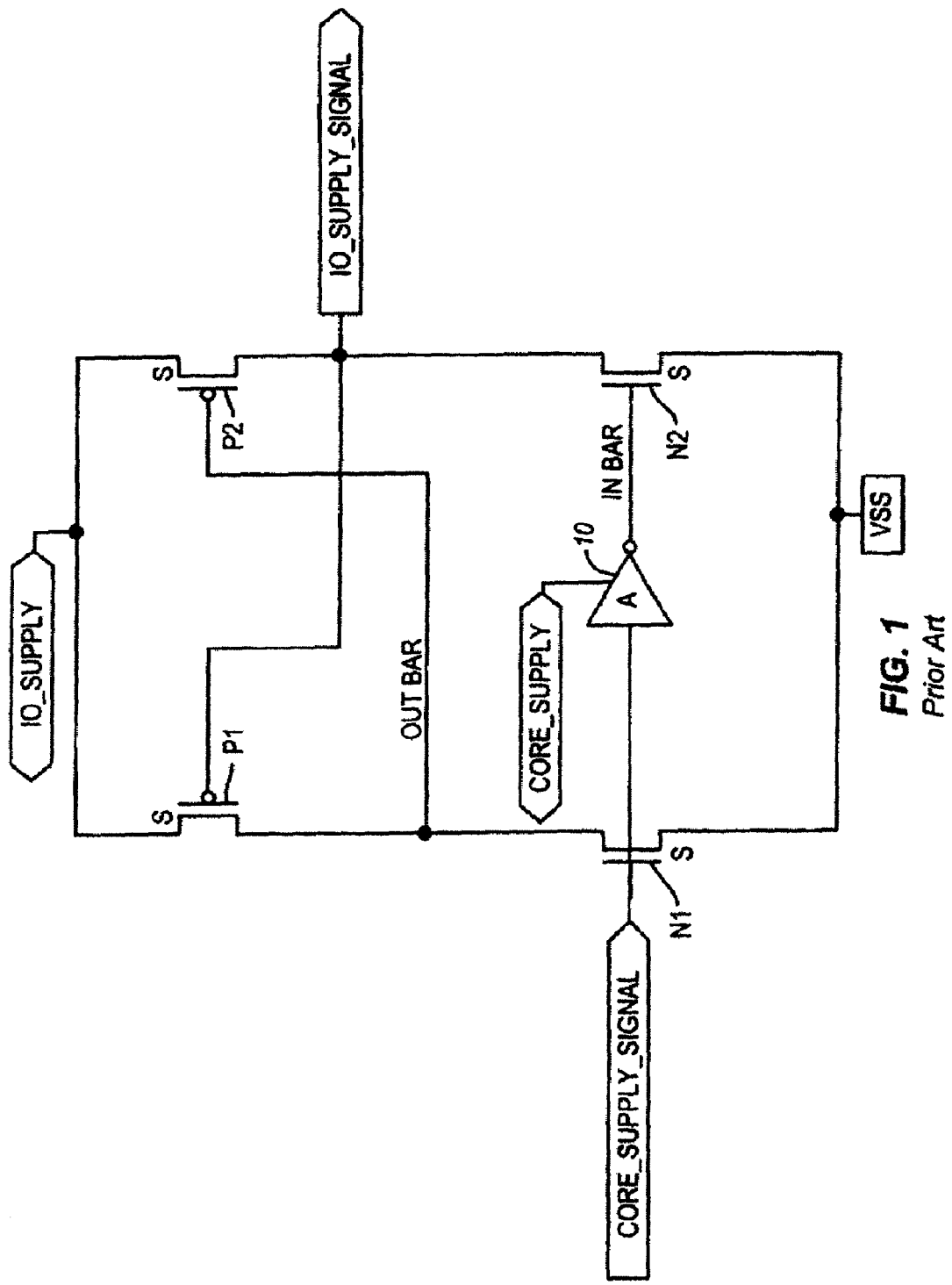
FIG. 1 is a diagram of a conventional prior art level shifter circuit.
Figure 2:
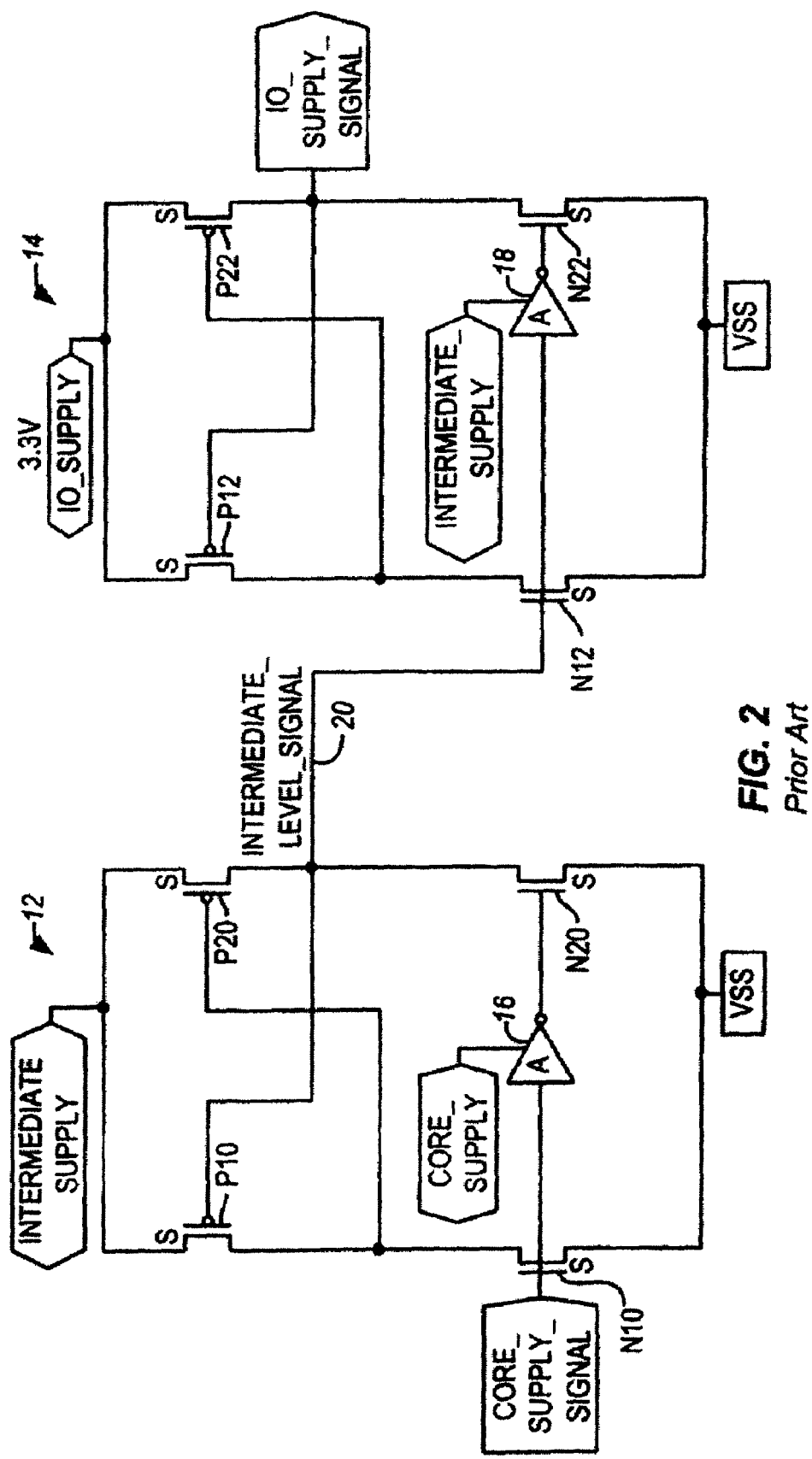
FIG. 2 is a diagram of a prior art two-stage level shifter circuit.
Figure 3:
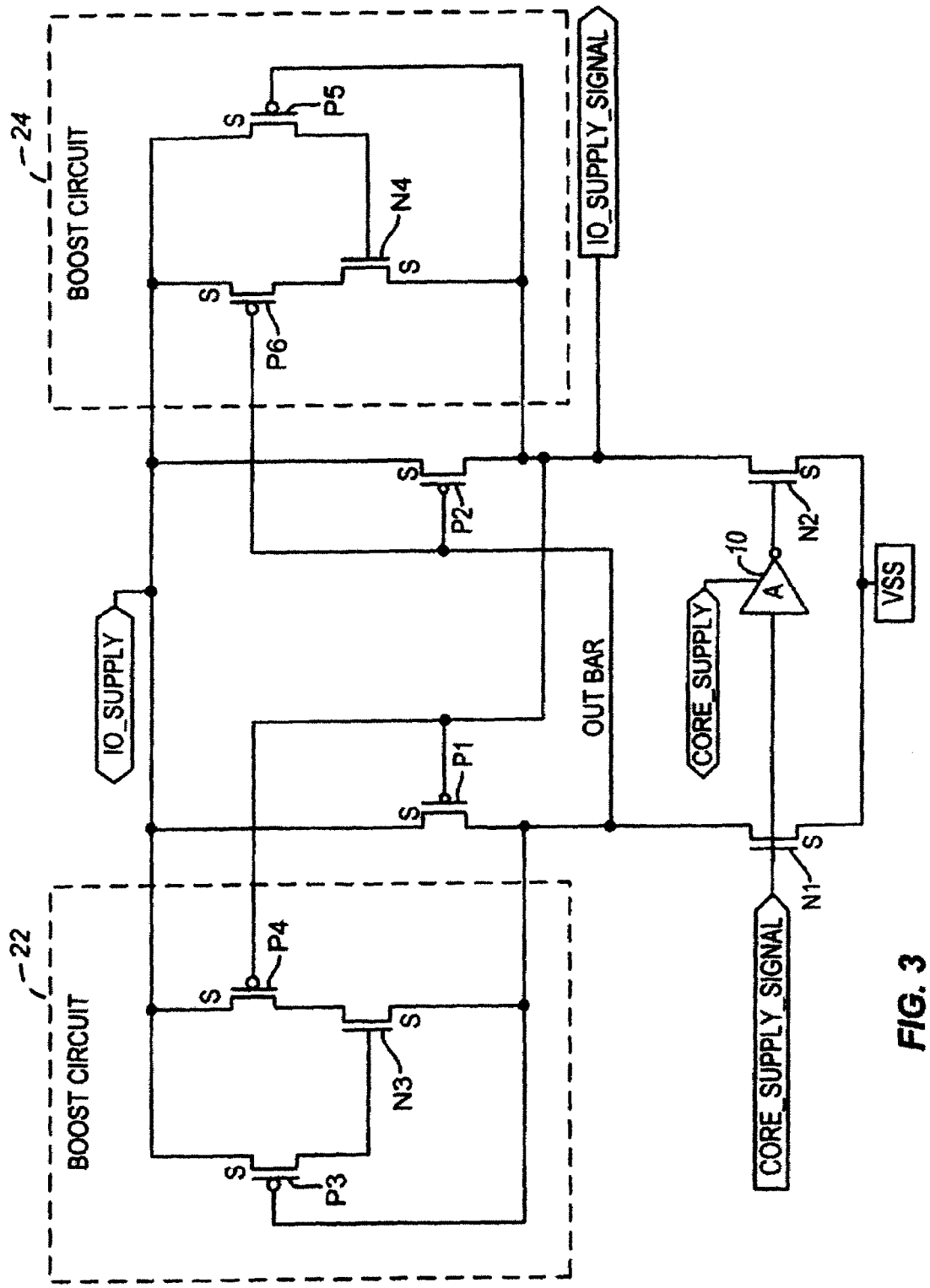
FIG. 3 is a diagram of an embodiment of the invention using a boost circuit.

FIG. 3 illustrates an embodiment of a level shifter circuit according to the invention. FIG. 3 shows the same basic configuration of transistors N1 and N2 with inverter 10 of FIG. 1, along with pull-up transistors P1 and P2. In addition, boost circuits 22 and 24 have been added. Boost circuit 22 includes an NMOS transistor N3 with its source connected to OUT_BAR, which is connected to the drain of transistor P1. The drain of transistor N3 is connected to the IO supply voltage through a pull-up PMOS transistor P4. The gate of transistor N3 is connected to the IO supply through a pull-up PMOS transistor P3.

Similarly, boost circuit 24 provides an NMOS transistor N4 connected to the output signal, the IO_SUPPLY_SIGNAL, and the drain of transistor P2. A pull-up PMOS transistor P6 connects the drain of transistor N4 to the IO supply voltage, and another pull-up transistor P5 connects the gate of transistor N4 to the IO supply voltage.

When CORE_SUPPLY_SIGNAL goes from '0' to '1' and before any switching happens, below is a summary of the status of the transistors in FIG. 3. The status below is not a balanced one and subject to changes that will be analyzed as follows:

N1 from OFF to ON;
N2 from ON to OFF;
P1 and P4 stay ON;
P2 and P6 stay OFF;
P3 stays OFF;
P5 stays ON;
N3 stays OFF; and
N4 stays ON.

Note that N2 changes from ON to OFF. As a result, the net IO_SUPPLY_SIGNAL will rise and try to follow the gate voltage of N4. With the rising of IO_SUPPLY_SIGNAL, the pull up strength of P1 and P2 will be reduced. As a result, the net OUT_BAR will fall quickly. It in turn makes the IO_SUPPLY_SIGNAL rise more quickly.

When the IO_SUPPLY_SIGNAL rises to around (Vio−Vth), where Vio is the IO supply and Vth is the threshold voltage of NMOS, N4 will no longer provide the pull-up. It will depend on P2 to continue to rise to the IO supply level. The objective of the speed-up is achieved because (Vio−Vth) is high enough to cross the threshold of the logic gates it is going to drive.

FIGS. 4A and B present simulation results for performance of a conventional level shifter (FIG. 4A) and an embodiment of the level shifter of the invention (FIG. 4B) when converting 100 MHz 0.9V input signal into 3.6V signal. FIG. 4A shows the voltage waveforms of the input and output signals of the level shifter circuit in FIG. 1. FIG. 4B shows the voltage waveforms of the input and output signals of the level shifter circuit in FIG. 3. It is clear that the level shifter circuit of the present invention can operate at a much higher working frequency.

Referring to the conventional level shifter of FIG. 4A, a fairly sharp signal transition 26 can be seen for the 0.9V input signal which would be applied to transistor N1. The corresponding output signal of the level shifter circuit at the 3.3V level has a slow transition 28. As explained before, the reason for the slow transition is that the P1 and P2 transistors need to be weaker than the N1 and N2 transistors so that they do not overwhelm the N1 and N2 transistors and prevent the switching transition from happening.

Turning to FIG. 4B, the same 0.9V transition 26 produces a much sharper transition 30 at the output of the level shifter circuit.

As noted above, the boost circuit will turn itself off when the output voltage reaches $V_{io}$, minus $V_{th}$. For $V_{io}$ equal 3 volts and $V_{th}$ equals 0.6-0.9 volts, this gives a turn-off in the range of 2.1-2.4 V, more than enough to exceed the typical 1.5 V threshold for changing state in a 3.3V circuit. Note that the threshold voltage for the transistors can vary depending upon how the devices are manufactured, and that the threshold voltage can also be varied depending upon the design.

The extent of the 3.3V, or second level, circuit on the integrated circuit chip could be simply the output signal and the 3.3V voltage supply line. The transistors shown in the embodiments of the invention can be standard transistors made by standard processing steps which are known to those of skill in the art for the 0.9V technology.

In other embodiments, the present invention provides means for switching an input signal, means for inverting the input signal, and means for providing the inverted signal to an output. Additionally, means for pulling-up a line connected to the input transistor and pulling up the output signal line are provided. In addition, means for boosting these pulling-up functions are provided. In particular, the means for boosting comprises means for providing a pull-up boost with another pull-up transistor, and means for biasing the boost pull-up transistor so that it provides stronger pull-up than the main pull-up transistor and shuts itself down after the transition.

Figure 5A:
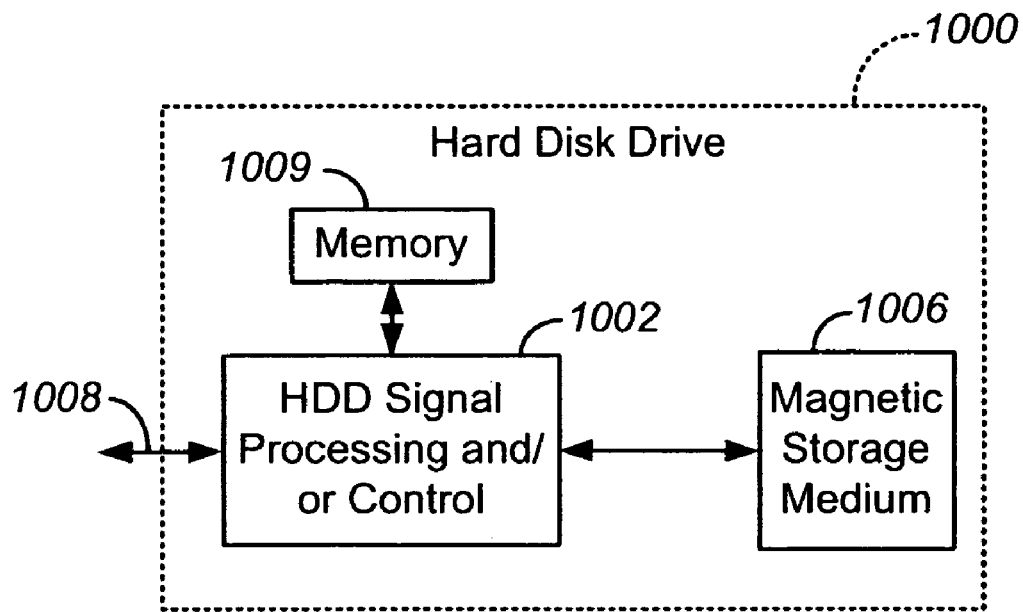
FIGS. 5A-5H show various devices in which the present invention may be embodied.

Referring now to FIGS. 5A-5G, various exemplary implementations of the present invention are shown. Referring to FIG. 5A, the present invention may be embodied in a hard disk drive 1000. The present invention may implement either or both signal processing and/or control circuits, which are generally identified in FIG. 5A at 1002. In some implementations, signal processing and/or control circuit 1002 and/or other circuits (not shown) in HDD 1000 may process data, perform coding and/or encryption, perform calculations, and/or format data that is output to and/or received from a magnetic storage medium 1006.

HDD 1000 may communicate with a host device (not shown) such as a computer, mobile computing devices such as personal digital assistants, cellular phones, media or MP3 players and the like, and/or other devices via one or more wired or wireless communication links 1008. HDD 1000 may be connected to memory 1009, such as random access memory (RAM), a low latency nonvolatile memory such as flash memory, read only memory (ROM) and/or other suitable electronic data storage.

Figure 5B:
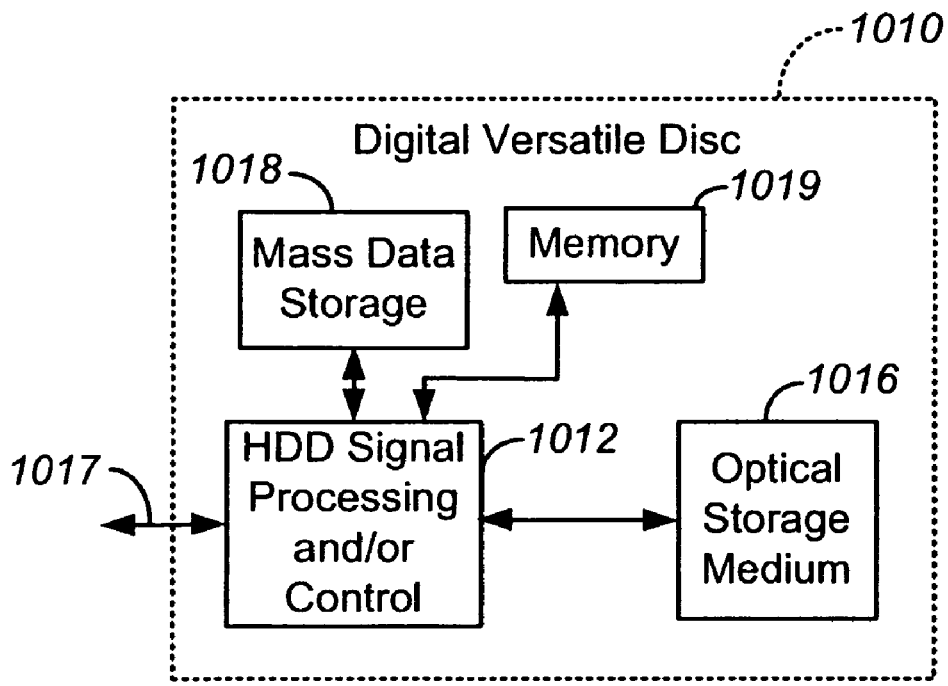

Referring now to FIG. 5B, the present invention may be embodied in a digital versatile disc (DVD) drive 1010. The present invention may implement either or both signal processing and/or control circuits, which are generally identified in FIG. 5B at 1012, and/or mass data storage 1018 of DVD drive 1010. Signal processing and/or control circuit 1012 and/or other circuits (not shown) in DVD 1010 may process data, perform coding and/or encryption, perform calculations, and/or format data that is read from and/or data written to an optical storage medium 1016. In some implementations, signal processing and/or control circuit 1012 and/or other circuits (not shown) in DVD 1010 can also perform other functions such as encoding and/or decoding and/or any other signal processing functions associated with a DVD drive.

DVD drive 1010 may communicate with an output device (not shown) such as a computer, television or other device via one or more wired or wireless communication links 1017. DVD 1010 may communicate with mass data storage 1018 that stores data in a nonvolatile manner. Mass data storage 1018 may include a hard disk drive (HDD) such as that shown in FIG. 5A. The HDD may be a mini HDD that includes one or more platters having a diameter that is smaller than approximately 1.8" DVD 1010 may be connected to memory 1019, such as RAM, ROM, low latency nonvolatile memory such as flash memory, and/or other suitable electronic data storage.

Figure 5C:
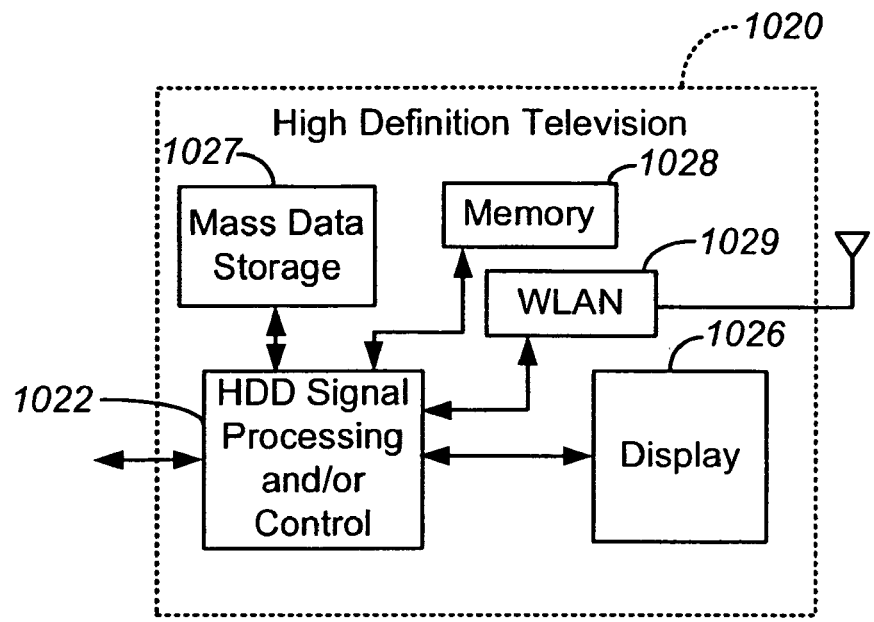

Referring now to FIG. 5C, the present invention may be embodied in a high definition television (HDTV) 1020. The present invention may implement either or both signal processing and/or control circuits, which are generally identified in FIG. 5C at 1022, a WLAN interface and/or mass data storage of the HDTV 1020. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with mass data storage 1027 that stores data in a nonvolatile manner such as optical and/or magnetic storage devices. At least one HDD may have the configuration shown in FIG. 5A and/or at least one DVD may have the configuration shown in FIG. 5B. The HDD may be a mini HDD that includes one or more platters having a diameter that is smaller than approximately 1.8". HDTV 1020 may be connected to memory 1028 such as RAM, ROM, low latency nonvolatile memory such as flash memory and/or other suitable electronic data storage. HDTV 1020 also may support connections with a WLAN via a WLAN network interface 1029.

Figure 5D:
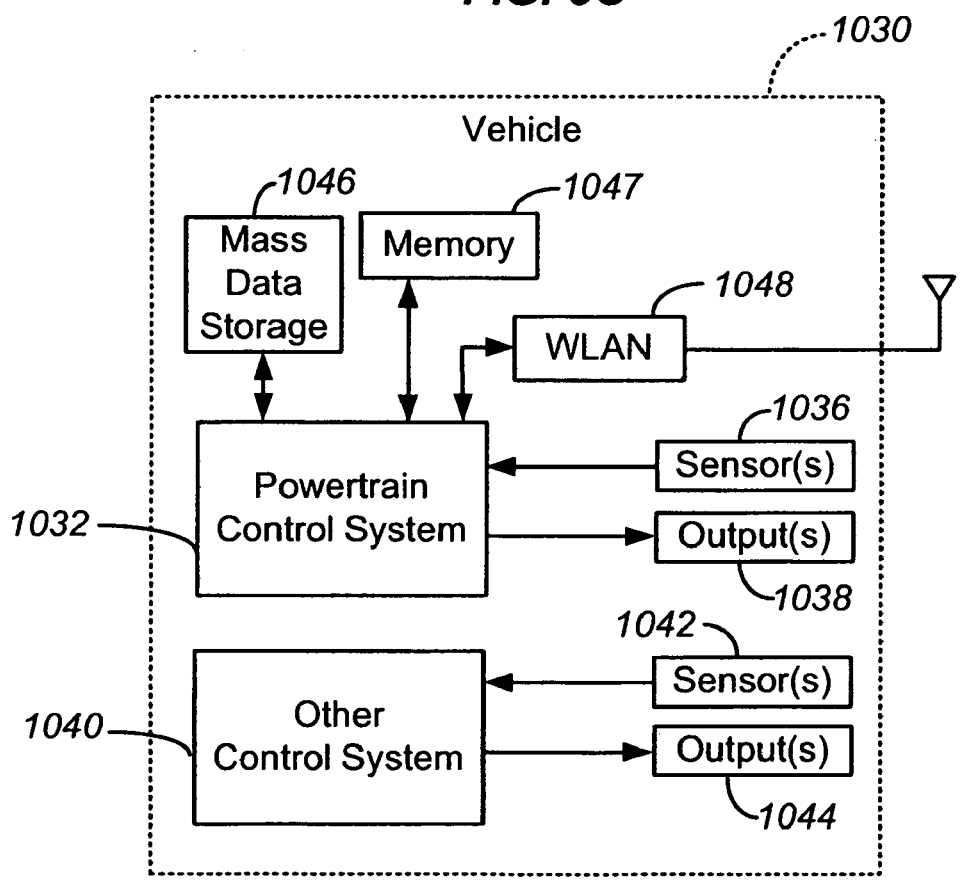

Referring now to FIG. 5D, the present invention implements a control system of a vehicle 1030, a WLAN interface and/or mass data storage of the vehicle control system. In some implementations, the present invention implements a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1040 of vehicle 1030. Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1032 may communicate with mass data storage 1046 that stores data in a nonvolatile manner. Mass data storage 1046 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Powertrain control system 1032 may be connected to memory 1047 such as RAM, ROM, low latency nonvolatile memory such as flash memory and/or other suitable electronic data storage. Powertrain control system 1032 also may support connections with a WLAN via a WLAN network interface 1048. The control system 1040 may also include mass data storage, memory and/or a WLAN interface (all not shown).

Figure 5E:
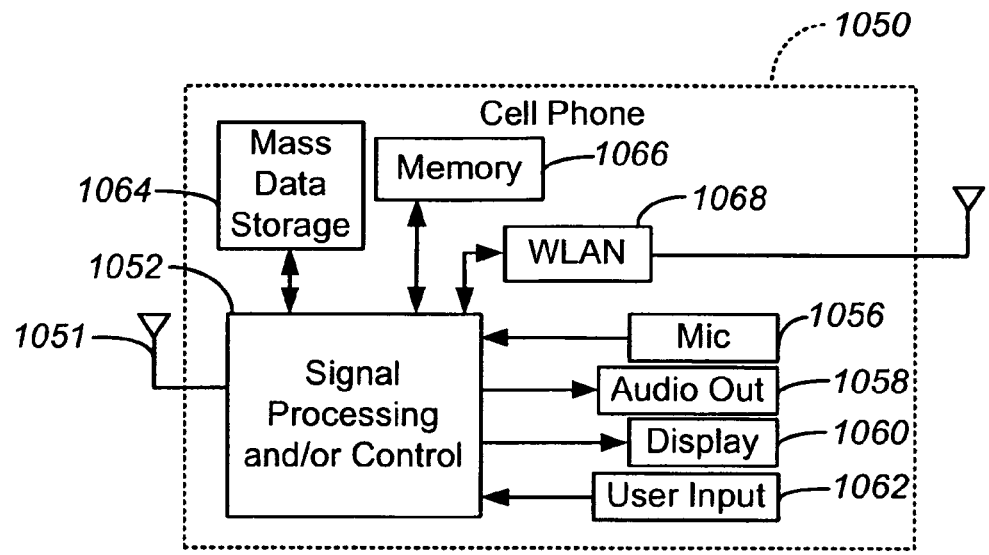

Referring now to FIG. 5E, the present invention may be embodied in a cellular phone 1050 that may include a cellular antenna 1051. The present invention may implement either or both signal processing and/or control circuits, which are generally identified in FIG. 5E at 1052, a WLAN interface and/or mass data storage of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate With mass data storage 1064 that stores data in a nonvolatile manner such as optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068.

Figure 5F:
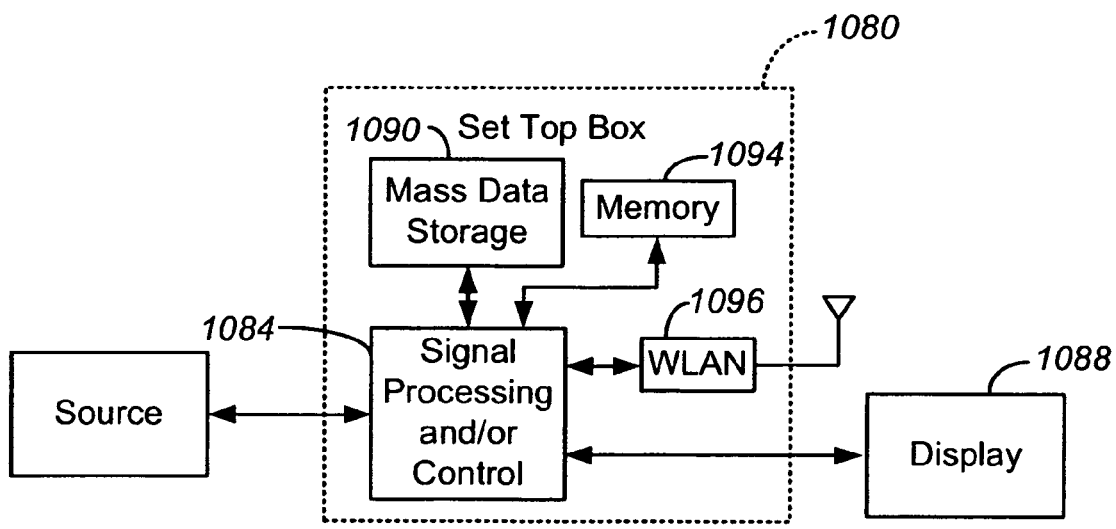

Referring now to FIG. 5F, the present invention may be embodied in a set top box 1080. The present invention may implement either or both signal processing and/or control circuits, which are generally identified in FIG. 5F at 1084, a WLAN interface and/or mass data storage of the set top box 1080. Set top box 1080 receives signals from a source such as a broadband source and outputs standard and/or high definition audio/video signals suitable for a display 1088 such as a television and/or monitor and/or other video and/or audio output devices. Signal processing and/or control circuits 1084 and/or other circuits (not shown) of the set top box 1080 may process data, perform coding and/or encryption, perform calculations, format data and/or perform any other set top box function.

Set top box 1080 may communicate with mass data storage 1090 that stores data in a nonvolatile manner. Mass data storage 1090 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via a WLAN network interface 1096.

Figure 5G:
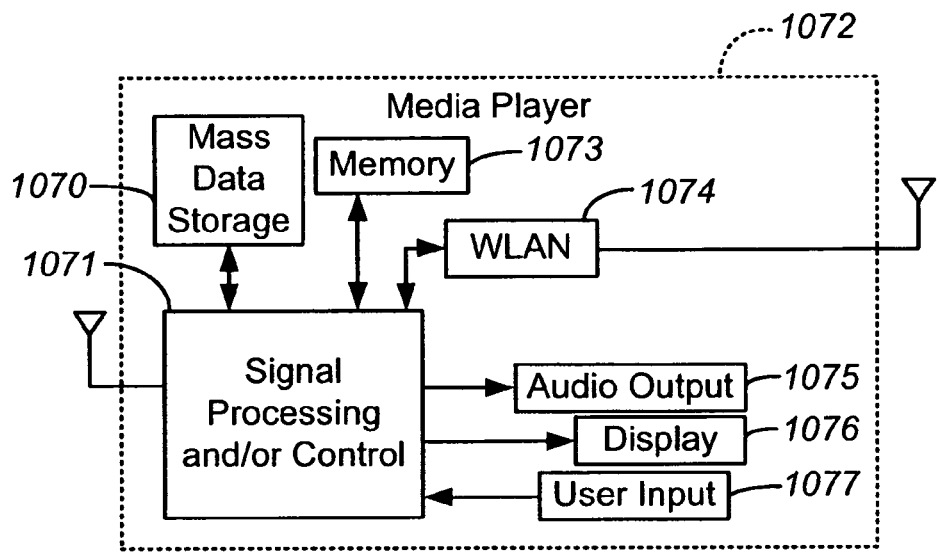

Referring now to FIG. 5G, the present invention may be embodied in a media player 1072. The present invention may implement either or both signal processing and/or control circuits, which are generally identified in FIG. 5G at 1071, a WLAN interface and/or mass data storage of the media player 1072. In some implementations, media player 1072 includes a display 1076 and/or a user input 1077 such as a keypad, touchpad and the like. In some implementations, media player 1072 may employ a graphical user interface (GUI) that typically employs menus, drop down menus, icons and/or a point-and-click interface via display 1076 and/or user input 1077. Media player 1072 further includes an audio output 1075 such as a speaker and/or audio output jack. Signal processing and/or control circuits 1071 and/or other circuits (not shown) of media player 1072 may process data, perform coding and/or encryption, perform calculations, format data and/or perform any other media player function.

Media player 1072 may communicate with mass data storage 1070 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Media player 1072 may be connected to memory 1073 such as RAM, ROM, low latency nonvolatile memory such as flash memory and/or other suitable electronic data storage. Media player 1072 also may support connections with a WLAN via a WLAN network interface 1074.

Figure 5H:
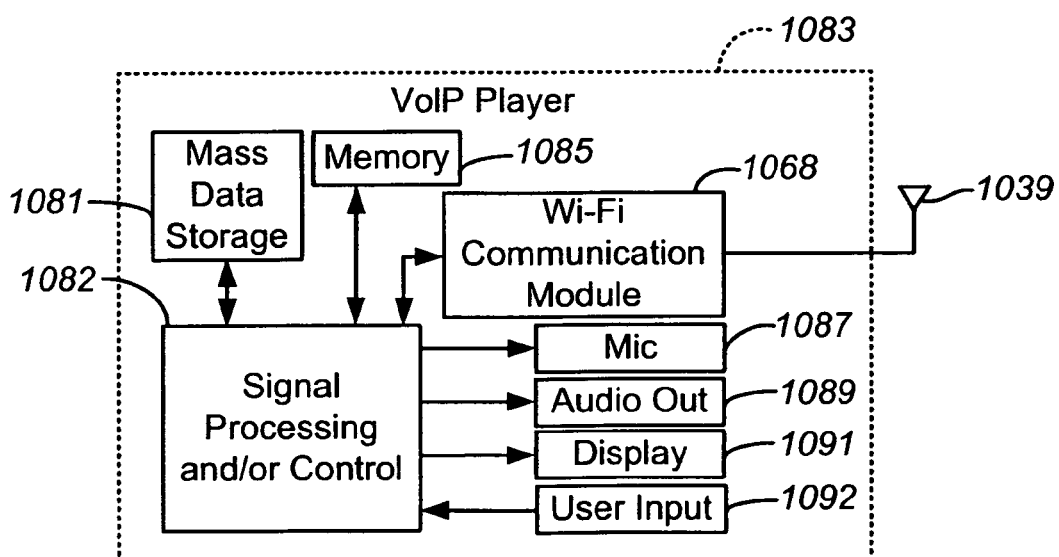

Referring to FIG. 5H, the present invention may be embodied in a Voice over Internet Protocol (VoIP) phone 1083 that may include an antenna 1039. The present invention may implement either or both signal processing and/or control circuits, which are generally identified in FIG. 5H at 1082, a wireless interface and/or mass data storage of the VoIP phone 1083. In some implementations, VoIP phone 1083 includes, in part, a microphone 1087, an audio output 1089 such as a speaker and/or audio output jack, a display monitor 1091, an input device 1092 such as a keypad, pointing device, voice actuation and/or other input devices, and a Wireless Fidelity (Wi-Fi) communication module 1086. Signal processing and/or control circuits 1082 and/or other circuits (not shown) in VoIP phone 1083 may process data, perform coding and/or encryption, perform calculations, format data and/or perform other VoIP phone functions.

VoIP phone 1083 may communicate with mass data storage 502 that stores data in a nonvolatile manner such as optical and/or magnetic storage devices, for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". VoIP phone 1083 may be connected to memory 1085, which may be a RAM, ROM, low latency nonvolatile memory such as flash memory and/or other suitable electronic data storage. VoIP phone 1083 is configured to establish communications link with a VoIP network (not shown) via Wi-Fi communication module 1086. Still other implementations in addition to those described above are contemplated.

As will be appreciated by those of skill in the art, the present invention may be embodied in other specific forms without departing from the essential characteristics of the invention. For example, only one of the pull-up transistors could have a boost circuit coupled to it. The transistors themselves could be of varying size, with the boost pull-up transistor being the same size as the pull-up transistor it is assisting in one instance, similarly being weak compared to the input and output transistors. In one embodiment, the transistors have a feature size of no more than 90 nanometers. In other embodiments, the transistors may have a different, in particular smaller, feature size. Alternately, since the boost circuit will turn itself off after the transition, it is possible to use a larger size transistor, such as a transistor of the same size as the input and output transistors or of an intermediate size. Accordingly, the foregoing description is intended to be illustrative, but not limiting, of the scope of the invention which is set forth in the following claims.

What is claimed is:

1. A CMOS level shifter circuit comprising:
   an input transistor;
   an output transistor;
   an inverter arranged between said input and output transistors and in communication with a first level voltage supply;
   a first pull-up transistor in communication with said input transistor and a second level voltage supply;
   a second pull-up transistor in communication with said output transistor and said second level voltage supply; and
   a boost circuit, in communication with at least one of said first and second pull-up transistors,
   wherein the boost circuit includes:
   first and second boost pull-up transistors with a source or a drain of said first boost pull-up transistor coupled to a source or drain of either said first or second pull-up transistors and a source or drain of said second boost pull-up transistor coupled to the other of said source or said drain of either said first or second pull-up transistors; and
   at least one boost biasing transistor with a source or drain coupled to a gate of one of said first and second boost pull-up transistors and the other of said source or drain of said at least one boost biasing transistor coupled to said second level voltage supply.

2. The circuit of claim 1 wherein said boost circuit is configured to pull-up a signal line in conjunction with at least one of said first and second pull-up transistors, configured to provide a faster signal transition than said pull-up transistors alone.

3. The circuit of claim 2 wherein said boost circuit comprises first and second boost circuits for said first and second pull-up transistors, said first boost circuit comprising:
   said first boost pull-up transistor in communication with a first signal line being pulled up by said first pull-up transistor;
   said second boost pull-up transistor arranged between a voltage supply and one of the source and drain of said first pull-up transistor;
   a said at least one boost biasing transistor,
   said second boost circuit comprising:
   a third boost pull-up transistor in communication with a second signal line being pulled up by said second pull-up transistor;
   a fourth boost pull-up transistor arranged between said voltage supply and one of the source and drain of said second pull-up transistor; and a second boost biasing transistor arranged between a gate of said third boost pull-up transistor and said voltage supply.

4. The circuit of claim 3 wherein:
said input and output transistors are NMOS transistors;
said first and second pull-up transistors are PMOS transistors;
said first and third boost pull-up transistors are NMOS transistors;
said second and fourth boost pull-up transistors are PMOS transistors; and
said at least one and second boost biasing transistors are PMOS transistors.

5. The circuit of claim 1 wherein said first and second pull-up transistors are weaker than said input and output transistors.

6. The circuit of claim 1 wherein said input transistor is connected to a circuit with a supply voltage of about 0.9 volts, and said output transistor is connected to a circuit with a supply voltage of about 3.3 volts.

7. A CMOS level shifter circuit for shifting from a first voltage level circuit to a second level voltage supply circuit, comprising:
an input NMOS transistor coupled to said first level circuit;
an output NMOS transistor coupled to said second level circuit;
an inverter coupled between said input and output transistors, said inverter being coupled to a voltage supply for said first level circuit;
a first pull-up PMOS transistor connected to a drain of said input transistor and a voltage supply for said second level circuit;
a second pull-up PMOS transistor connected to an output line which is connected to a drain of said output transistor and said voltage supply for said second level circuit;
a first boost circuit, coupled to said first pull-up PMOS transistor, including
    a first NMOS boost pull-up transistor coupled to said drain of said input transistor and a source or drain of said first pull-up PMOS transistor,
    a first PMOS boost biasing transistor coupled to a gate of said first boost NMOS pull-up transistor and said voltage supply for said second level circuit, and
    a first PMOS boost pull-up transistor coupled between said voltage supply for said second level circuit and said other of said source or drain of said first pull-up PMOS transistor; and
a second boost circuit, coupled to said second pull-up PMOS transistor, to speed the transition of said second pull-up transistor, including
    a second NMOS boost pull-up transistor coupled to said drain of said output transistor and a source or drain of said second pull up PMOS transistor,
    a second PMOS boost biasing transistor coupled to a gate of said second boost NMOS pull-up transistor and said voltage supply for said second level circuit, and
    a second PMOS boost pull-up transistor coupled between said voltage supply for said second level circuit and said other of said source or drain of said second pull-up PMOS transistor.

8. The circuit of claim 7 wherein said voltage supply for said first level circuit is about 0.9 volts, and said voltage supply for said second level circuit is about 3.3 volts.

9. A method for shifting voltage levels in a CMOS integrated circuit comprising:
providing an input signal at a first voltage level to an input transistor;
inverting said input signal to produce an inverted signal;
providing said inverted signal to an output signal line at a second voltage level with an output transistor;
pulling-up a node of said input transistor towards a second level voltage supply with a first pull-up transistor;
pulling up said output signal line towards said second level voltage supply with a second pull-up transistor; and
boosting the pulling up by at least one of said first and second pull-up transistors with a boost circuit, coupled to at least one of said first and second pull-up transistors, to speed the transition of said pull-up transistors, wherein the boost circuit includes:
first and second boost pull-up transistors with a source or a drain of said first boost pull-up transistor coupled to a source or drain of either said first or second pull-up transistors and a source or drain of said second boost pull-up transistor coupled to the other of said source or said drain of either said first or second pull-up transistors; and
at least one boost biasing transistor with a source or drain coupled to a gate of one of said first and second pull-up transistor and the other of said source or drain of said at least one boost biasing transistor coupled to said second level voltage supply.

10. The method of claim 9 wherein said boost circuit provides a faster signal transition than that of said pull-up transistors.

11. The method of claim 10 further comprising:
providing a boost pull-up of a signal line being pulled up by one of said first and second pull-up transistors;
biasing said boost pull-up transistors with said at least one boost biasing transistor; and
providing a boost pull-up of said signal line being pulled up with said second boost pull-up transistor coupled to said voltage supply.

12. The method of claim 11 further comprising:
forming said input and output transistors as NMOS transistors;
forming said first and second pull-up transistors as PMOS transistors;
forming said first boost pull-up transistor as an NMOS transistor; and
forming said second boost pull-up transistor as a PMOS transistor; and
forming said at least one boost biasing transistor as a PMOS transistor.

13. The method of claim 9 further wherein said first and second pull-up transistors act more weakly than said input and output transistors.

14. The method of claim 9 further comprising:
connecting said input transistor to a circuit with a supply voltage of about 0.9 volts, and
connecting said output transistor to a circuit with a supply voltage of about 3.3 volts.

15. A method for shifting voltage levels in a CMOS integrated circuit for shifting from a first voltage level circuit to a second level voltage supply circuit, comprising:
providing an input signal at a first voltage level to an input NMOS transistor;
inverting said input signal to produce an inverted signal with an inverter coupled to a voltage supply for said first level circuit;

providing said inverted signal to an output signal line at a second voltage level with an NMOS output transistor coupled to said second level circuit;

pulling-up a drain of said input transistor toward a voltage supply for said second level circuit with a first pull-up PMOS transistor;

pulling up said output signal line toward said voltage supply for said second level circuit with a second pull-up PMOS transistor which is connected to a drain of said output transistor;

boosting said pulling-up by said first pull-up PMOS transistor, to speed the transition of said first pull-up PMOS transistor, including pulling up said drain of said input transistor with a first NMOS boost pull-up transistor coupled to a source or drain of said first pull-up PMOS transistor, pulling-up a drain of said first NMOS boost pull-up transistor with a first PMOS boost pull-up transistor coupled to a voltage supply for a second level circuit and said other of said source or drain of said first pull-up PMOS transistor, biasing a gate of said first boost NMOS pull-up transistor with a first PMOS boost biasing transistor coupled to said voltage supply for said second level circuit and said first boost NMOS pull-up transistor, and boosting said pulling up by said second pull-up PMOS transistor, to speed the transition of said second pull-up PMOS transistor, including pulling up said drain of said input transistor with a second NMOS boost pull-up transistor coupled to a source or drain of said second pull-up PMOS transistor, pulling-up said drain of said second NMOS boost pull-up transistor with a second PMOS boost pull-up transistor coupled to said voltage supply for said second level circuit and said other of said source or drain of said second pull-up PMOS transistor; and biasing a gate of said second NMOS boost pull-up transistor with a second PMOS boost biasing transistor coupled to said voltage supply for said second level circuit and said second NMOS boost pull-up transistor.

16. The method of claim 15 wherein said voltage supply for said first level circuit is about 0.9 volts, and said voltage supply for said second level circuit is about 3.3 volts.

\* \* \* \* \*